United States Patent
Ting et al.

(10) Patent No.: US 10,079,143 B2
(45) Date of Patent: Sep. 18, 2018

(54) METHOD OF FORMING SEMICONDUCTOR DEVICE HAVING WICK STRUCTURE

(71) Applicant: UNITED MICROELECTRONICS CORP., Hsin-Chu (TW)

(72) Inventors: Hsu Ting, Tainan (TW); Chun-Wei Yu, Tainan (TW); Chueh-Yang Liu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/636,660

(22) Filed: Jun. 29, 2017

(65) Prior Publication Data

US 2017/0330742 A1  Nov. 16, 2017

Related U.S. Application Data

(62) Division of application No. 15/150,444, filed on May 10, 2016, now Pat. No. 9,728,397.

(51) Int. Cl.
*H01L 21/02* (2006.01)
*H01L 27/088* (2006.01)
*H01L 21/8234* (2006.01)
*H01L 29/06* (2006.01)
*H01L 21/311* (2006.01)

(52) U.S. Cl.
CPC .... *H01L 21/0206* (2013.01); *H01L 21/31111* (2013.01); *H01L 21/31116* (2013.01); *H01L 21/823431* (2013.01); *H01L 27/0886* (2013.01); *H01L 29/0657* (2013.01)

(58) Field of Classification Search
CPC .......... H01L 21/02019; H01L 21/0206; H01L 21/3105; H01L 21/31055; H01L 21/31116; H01L 21/4828; H01L 21/823431
See application file for complete search history.

(56) References Cited

U.S. PATENT DOCUMENTS

| | | | |
|---|---|---|---|
| 9,159,808 B2 | 10/2015 | Chen et al. | |
| 9,620,503 B1 | 4/2017 | Liao | |
| 2011/0097889 A1* | 4/2011 | Yuan | H01L 21/76224 438/595 |
| 2015/0270159 A1* | 9/2015 | Huang | H01L 21/76229 438/427 |

* cited by examiner

*Primary Examiner* — Hoai V Pham
(74) *Attorney, Agent, or Firm* — Winston Hsu

(57) ABSTRACT

A semiconductor device and a method of forming the same, the semiconductor device includes fin shaped structures and a recessed insulating layer. The fin shaped structures are disposed on a substrate. The recessed insulating layer covers a bottom portion of each of the fin shaped structures to expose a top portion of each of the fin shaped structures. The recessed insulating layer has a curve surface and a wicking structure is defined between a peak and a bottom of the curve surface. The wicking structure is disposed between the fin shaped structures and has a height being about 1/12 to 1/10 of a height of the top portion of the fin shaped structures.

10 Claims, 4 Drawing Sheets

METHOD OF FORMING SEMICONDUCTOR DEVICE HAVING WICK STRUCTURE

CROSS REFERENCE TO RELATED APPLICATIONS

This application is a Divisional of U.S. application Ser. No. 15/150,444 filed May 10, 2016, and included herein by reference.

BACKGROUND OF THE INVENTION

1. Field of the Invention

The present invention relates to a semiconductor device and a method of forming the same, and more particularly to a semiconductor device with fin shaped structure and a method of forming the same.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non planar FETs, such as the fin field effect transistor (finFET) have three-dimensional structure, not only capable of increasing the contact to the gate but also improving the controlling of the channel region, such that the non planar FETs have replaced the planar FETs and become the mainstream of the development.

The current method of forming the finFETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the finFETs also faces more challenges and limitations. Hence, the semiconductor device and method of forming the same does still not fully meet the demand of the product, and requires further improvement.

SUMMARY OF THE INVENTION

It is one of the primary objectives of the present invention to provide a semiconductor device and a method of forming the same, in which the fin height can be preferably controlled and the semiconductor device can achieve better current performance thereby.

To achieve the purpose described above, the present invention provides a semiconductor device including two fin shaped structures and an insulating layer. The fin shaped structures are disposed on a substrate. The insulating layer covers a bottom portion of each of the fin shaped structures to expose a top portion of each of the fin shaped structures. The insulating layer has a curve surface and a wicking structure is defined between a peak and a bottom of the curve surface. The wicking structure is disposed between the fin shaped structures and has a height being about $\frac{1}{12}$ to $\frac{1}{10}$ of a height of the top portion of the fin shaped structures.

To achieve the purpose described above, the present invention provides a method of forming a semiconductor device including following steps. First of all, two fin shaped structures are formed in a substrate. Next, an insulating layer is formed on the substrate to cover the fin shaped structures. Then, a portion of the insulating layer is removed to expose a top portion of each of the fin shaped structures and the top portion of the fin shaped structures having a height. Finally, a first cleaning process is performed, and the height of the top portion of the fin shaped structures is maintained thereby.

According to above, a two-stepped cleaning process is performed after recessing the insulating layer between the fin shaped structures to remove the synthesized residue in the recessing process without reacting with the oxide of the insulating layer. In this way, the wicking structure formed at the sidewalls of fin shaped structures in the recessing process may be sufficiently minimized especially in the dense region of the substrate, such that, the coverage of the sidewalls by the wicking structure may be also minimized thereby. Thus, the current density of the entire semiconductor device may enable to be improved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 are schematic diagrams illustrating a method of forming a fin structure according to a first preferred embodiment of the present invention; wherein:

FIG. 1 shows a schematic diagram of a semiconductor device at the beginning of the forming process;

FIG. 2 shows a schematic diagram of a semiconductor device after forming an insulating layer;

FIG. 3 shows a schematic cross-sectional view of a semiconductor device after performing an etching back process; and FIG. 4 shows a schematic cross-sectional view of a semiconductor device after performing a cleaning process.

FIG. 5 to FIG. 7 are schematic diagrams illustrating a method of forming a fin structure according to a second preferred embodiment of the present invention; wherein:

FIG. 5 shows a schematic cross-sectional view of a semiconductor device after performing an etching back process;

FIG. 6 shows a schematic cross-sectional view of a semiconductor device after performing a cleaning process; and FIG. 7 shows a schematic cross-sectional view of a semiconductor device after performing another cleaning process.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
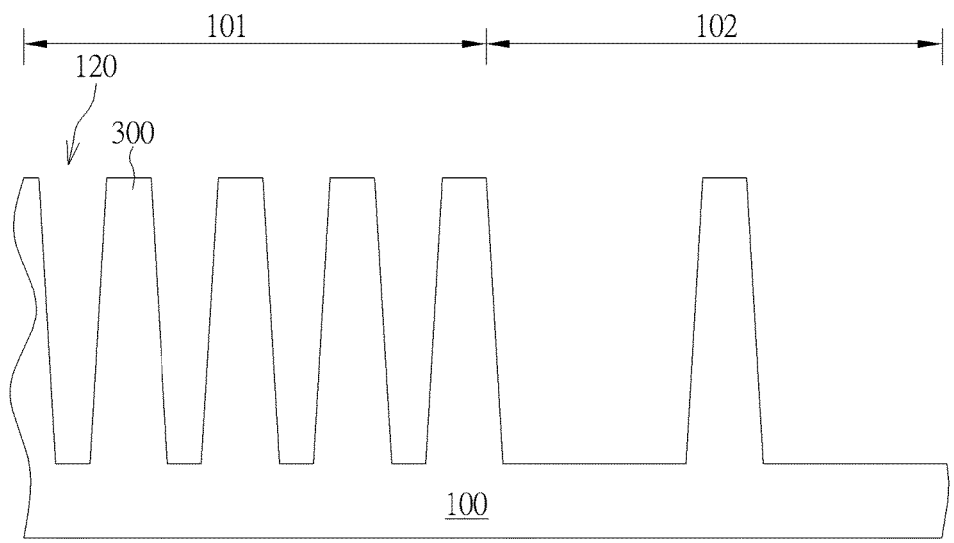

Referring to FIGS. 1-4, FIGS. 1-4 are schematic diagrams illustrating a method of forming a semiconductor device according to the first preferred embodiment of the present invention. First of all, as shown in FIG. 1, a substrate 100 is provided and at least one fin shaped structure 300 is disposed in the substrate 100. The substrate 100 for example includes a semiconductor substrate such as a silicon containing structure or a silicon on insulator (SOI), and further includes a dense region 101 and an isolated region 102. In the present embodiment, a plurality of the fin shaped structures 300 is disposed both in the dense region 101 and the isolated region 102 of the substrate 100 but in different pitches, as shown in FIG. 1. In one embodiment, the pitch of the fin shaped structures 300 in the dense region 101 is less than the pitch of the fin shaped structure 300 in the isolated region 102, meaning that the dense region 101 has a larger pattern density per unit area than that of the isolated region 102. Preferably, the pitch of the fin shaped structures 300 in the dense region 101 is substantially equal to the critical dimension (CD) of the manufacturing machine during the process.

In one embodiment of the present invention, the fin shaped structures 300 may be formed through a self-aligned double patterning (SADP) process, such as sidewall image transfer (SIT) process. For example, the formation of the fin shaped structures 300 includes forming a plurality of mandrels (not shown in the drawings) on the substrate 100 by using a photolithography and an etching process, performing a depositing and an etching processes sequentially to form a plurality of spacers (not shown in the drawings) at sidewalls of the mandrels, using the spacers as a mask to form a patterned hard mask underneath, and then, forming a plurality of shallow trenches 120 in the substrate 100 to define the fin shaped structures 300. However, in another embodiment of the present invention, the formation of the fin shaped structures 300 may also be accomplished by first forming a patterned hard mask (not shown in the drawings) on the substrate 100, and then performing an epitaxial process on the exposed substrate 100 through the patterned hard mask to form a semiconductor layer (not shown in the drawings) such as silicon or silicon germanium layer to configure as corresponding fin shaped structures. After that, a fin cut process (not shown in the drawings) may be performed to remove unnecessary fin shaped structures.

Figure 2:
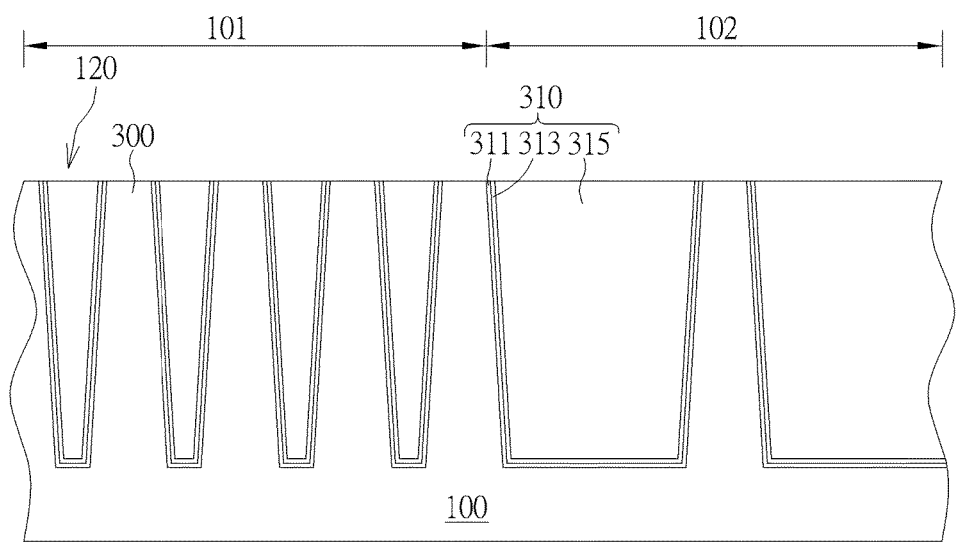

Next, as shown in FIG. 2, an insulating layer 310 is formed to at least fill in the shallow trenches 120 between the fin shaped structures 300. In one embodiment of the present invention, the insulating layer 310 includes a first insulating layer 311, a second insulating layer 313 and a third insulating layer 315 disposed on one over another as shown in FIG. 2. The first insulating layer 311, the second insulating layer 313 and the third insulating layer 315 may all include different dielectric materials or the same dielectric material with different densities. For example, the insulating layer 310 is formed right after the fin shaped structures 300 are formed, by entirely forming a first insulating material layer (not shown in the drawings) such as an oxide layer on the substrate 100 through an in situ steam generation (ISSG) process, forming a second insulating material layer (not shown in the drawings) such as another oxide layer over the first insulating material layer through an atomic layer deposition (ALD) process and finally forming a sacrificial layer (not shown in the drawings) over the second insulating material layer through a flowable chemical vapor deposition (FCVD) process, thereby forming a third insulating material layer (not shown in the drawings) such as another oxide layer to fill up the shallow trenches 120. Afterward, a planarization process (not shown in the drawings) is performed to simultaneously remove the first insulating material layer, the second insulating material layer and the third insulating material layer disposed outside the shallow trenches 120 and the patterned hard mask for defining the fin shaped structures 300, and the first insulating layer 311, the second insulating layer 313 and the third insulating layer 315 showed in FIG. 2 are formed.

Figure 3:
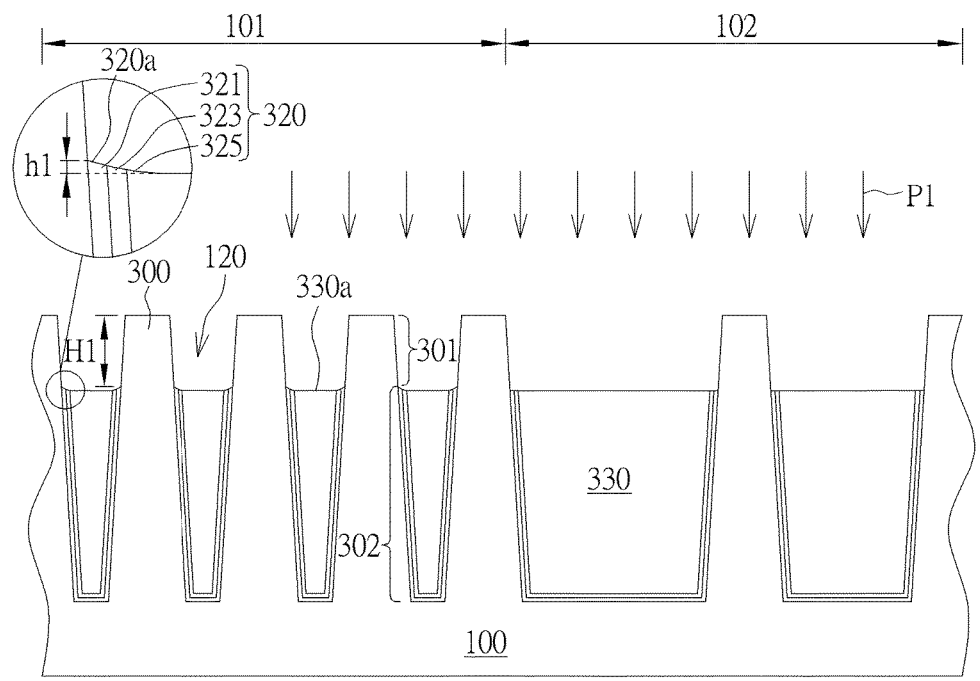

Then, a threshold voltage ($V_{th}$) implanting process may be performed to implanted proper dopant into the fin shaped structures 300 for adjusting the threshold voltage thereof, and an etching back process P1 is performed as shown in FIG. 3 to remove a portion of the insulating layer 310 thereby primary defining a height of fins. Precisely, a SiCoNi dry etching process may be performed to recess the insulating layer 310 till the exposure of a portion 301 of each of the fin shaped structures 300. In other words, a recessed insulating layer 330 only covers a bottom portion 302 of the fin shaped structure, so that, the portion 301 of the fin shaped structure 300 protrudes from the recessed insulating layer 330 to function like a fin with a height H, as shown in FIG. 3. The fin may further be used to form a transistor in subsequent process. In one embodiment of the present invention, the SiCoNi dry etching process primarily includes the step of reacting the fluorine-containing gas with the silicon oxide to synthesize diammonium fluosilicate (($NH_4)_2SiF_6$). In this way, the silicon oxide of the insulating layer 310 can be removed optionally. The aforesaid fluorine-containing gas can be hydrogen fluoride (HF) or nitrogen trifluoride ($NF_3$).

Figure 4:
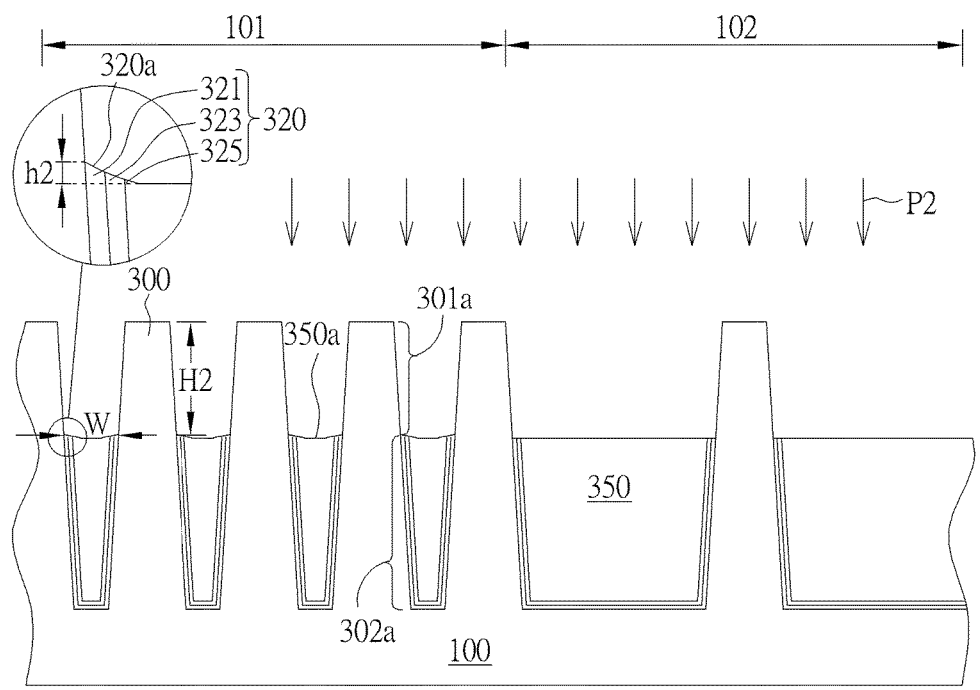

Following these, a post-etching cleaning process P2 such as an isotropic etching is performed to further define the height of the fins. For example, a wet etching process using dilute hydrofluoric acid (dHF) may be performed to further recess the recessed insulating layer 330. That is, a greater portion 301a of the fin shaped structure 300 is protruded from the recessed insulating layer 350. In this way, the fins (namely, the exposed portion 301a of the fin shaped structures 300) will obtain a height H2 which is greater than the height H1, as shown in FIG. 4.

Through the above mentioned steps, the semiconductor device according to the first preferred embodiment of the present invention is obtained. In the subsequent process of the present invention, a gate structure (not shown in the drawings) forming process, a stress memorization techniques (SMT) and a source/drain forming process may be performed then, for forming a finFET structure (not shown in the drawings). The semiconductor device of the present embodiment includes the fin shaped structures 300 both in the dense region 101 and the isolated region 102 and the recessed insulating layer 350 covered a bottom portion 302a of each of the fin shaped structures 300 to function like a shallow trench isolation (STI). That is, the exposed portion 301a of each of the fin shaped structures 300 exposed from the recessed insulating layer 350 as shown in FIG. 4 may function like the fins, and the height H2 of the fins is substantially between 360 nm to 450 nm.

It is noted that since the insulating layer 310 is consisted of the three insulating layers 311, 313, 315 with different materials or different densities, the etching selectivity therebetween are different accordingly. Through this manner, a curve surface 330a may be formed on the recessed insulating layer 330 in the etching back process P1 due to the etching rate of the HF and $NH_3$ based process gases along sidewalls of the shallow trenches 120 being different from the etching rate of the HF and $NH_3$ based process gases in the center of the shallow trenches 120. Thus, a wicking structure 320 with a height h1 may be defined between a peak and a bottom of the curve surface 330a, especially between the fin shaped structures 300 in the dense region 101.

It is also noted that, the wicking structure 320 is formed between the fins with a small pitch and which covers the sidewalls of the fin shaped structure 300 as shown in FIG. 3. The coverage of the wicking structure 320 on the fin shaped structure 300 affects the required height of the fins. Therefore, the fin height cannot be precisely controlled only through the etching back process P1, and the subsequent post-etching cleaning process P2 is performed to adjust the height of the fins. However, the recessed insulating layer 330 is namely isotropically etched in the post-etching cleaning process P2, the dHF of the post-etching cleaning process P2 further react with silicon oxide of the recessed insulating layer 330, so that the curve surface 330a thereof may recess more severely and become the curve surface 350a. In this way, an increased height h2 is obtained by the wicking structure 320, and the coverage of the sidewall of the fin shaped structure 300 by the wicking structure 320 is enhanced accordingly, as shown in FIG. 4. For example, the height h2 of the wicking structure 320 is about 50 to 60 angstroms while each fin are spaced from each other by a width W of about 25 nm to 35 nm. Furthermore, the wicking structure 320 includes a multilayer structure, for example includes a first layer 321 being formed from the first insulating layer 311 as shown in FIG. 2, and/or a second layer 323 being formed from the second insulating layer 313 as shown in FIG. 2 and/or a third layer 325 being formed from the third insulating layer 315 as shown in FIG. 2, in which the first layer 321, the second layer 323 and the third layer 325 preferably include silicon oxide with different densities.

In the present embodiment, the etching back process P1 such as the SiCoNi dry etching process and the post-etching cleaning process P2 are combined used to define the fin height. Through performing the post-etching cleaning process P2 after the SiCoNi process, the residue such as $(NH_4)_2SiF_6$ synthesized in the SiCoNi process may be removed. However, the dHF used in the post-etching cleaning process P2 will somehow consume the silicon of the fins, and which may lead to the defect and shrunk dimension of the fins. Furthermore, since the dHF of the post-etching cleaning process P2 may further react with the silicon oxide of the recessed insulating layer 330 shown in FIG. 3, the height H1 of fins will increase by the recessing of the recessed insulating layer 330. In this way, in order to obtain the fin in an expected height, a two-step recessing process is needed to be performed on the insulating layer 310 for precisely defining the fin height.

The following description will detail the different embodiments of the method of forming a semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
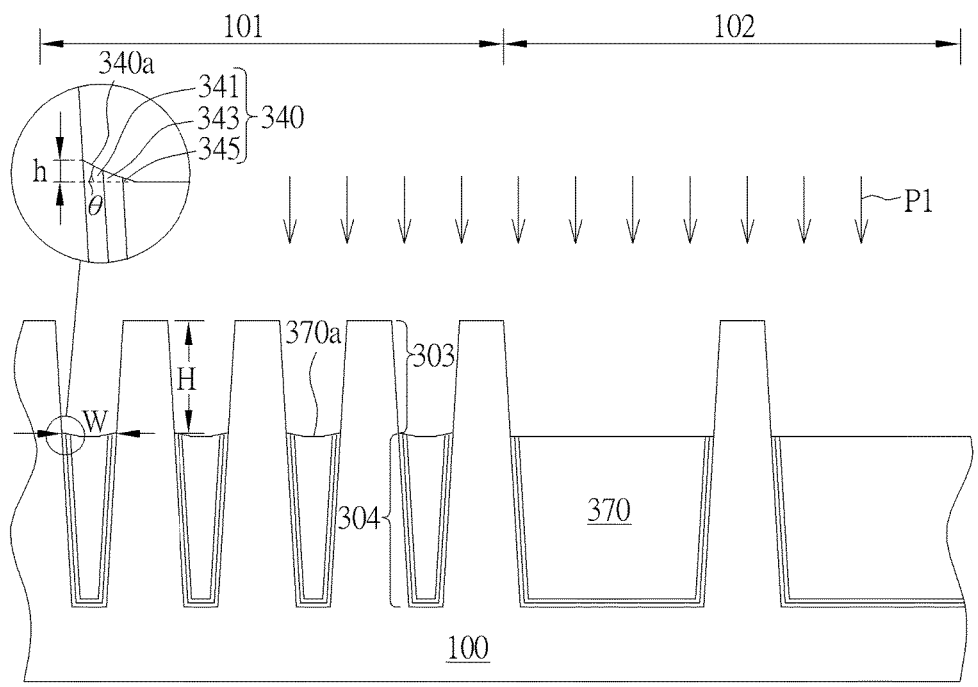
Figure 6:
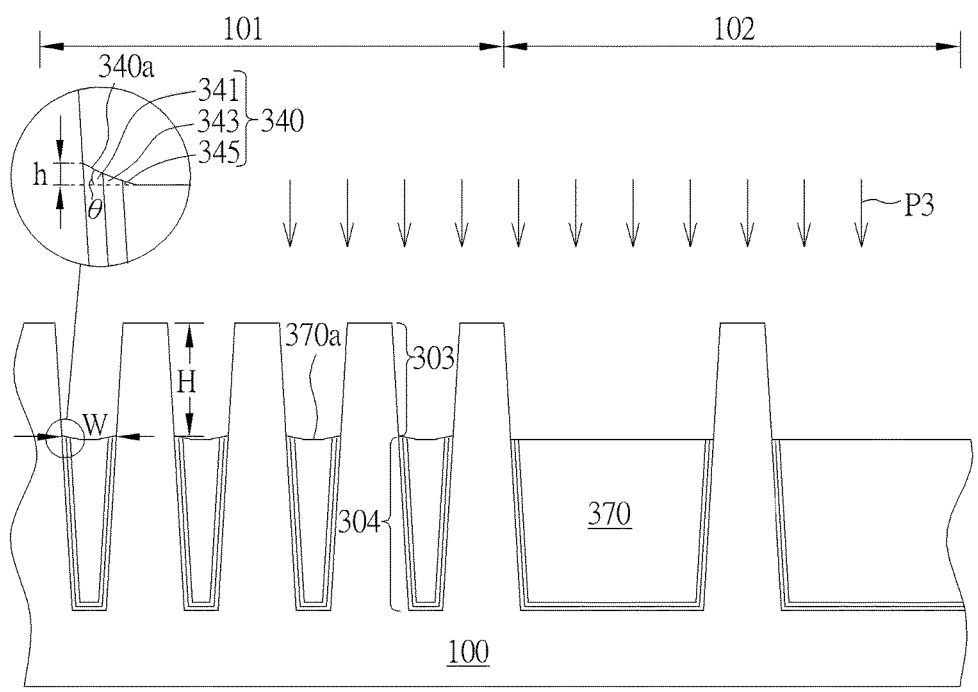
Figure 7:
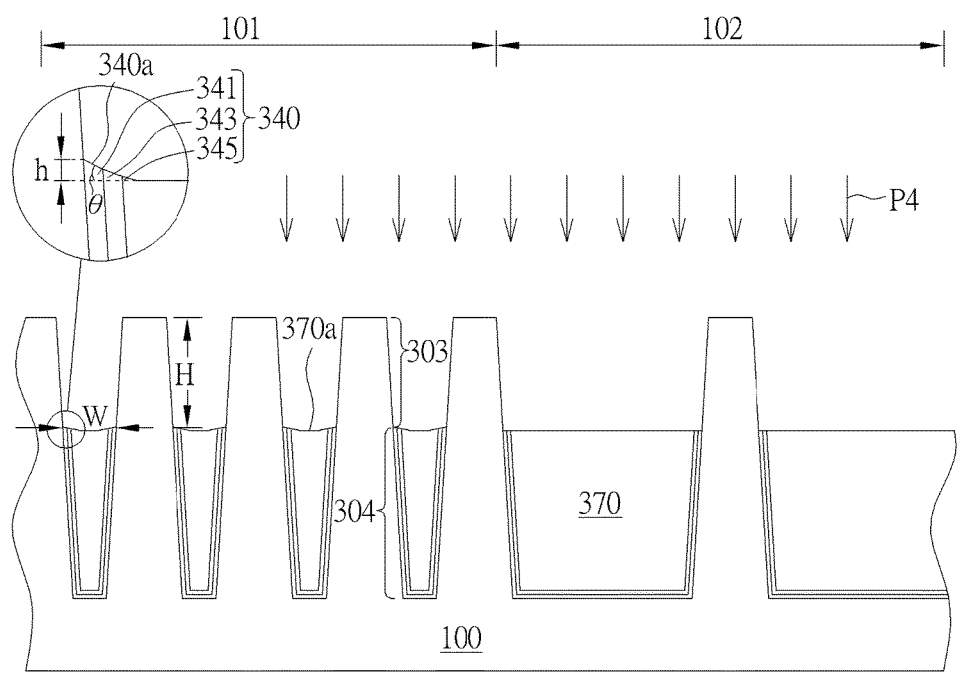

Referring to FIGS. 5-7, FIGS. 5-7 are schematic diagrams illustrating a method of forming a semiconductor device according to the second preferred embodiment of the present invention. The formal steps in the second preferred embodiment are substantially similar to those in FIGS. 1-2 in the first preferred embodiment and will not be redundantly described. The differences between the present invention and the aforementioned first preferred embodiment are in that, the fin height is directly defined through the etching back process P1.

Precisely, in the present embodiment, the etching back process P1 such as the SiCoNi dry etching process is performed to recess the insulating layer 310 shown in FIG. 2 till the exposure of a top portion 303 of each of the fin shaped structures 300, and a recessed insulating layer 370 is simultaneously formed to cover a bottom portion 304 of each of the fin shaped structures 300 as shown in FIG. 5.

That is, the top portion 303 of each of the fin shaped structure 300 which is protruded from the recessed insulating layer 370 may therefore function like the fin with a height H. The height H is substantially the same as the required height of the fin.

Then, a first cleaning process P3 such as a sulfuric acid-hydrogen peroxide mixture (SPM) cleaning process is performed after the etching back process P1 to react with the residue synthesized in the SiCoNi process, as shown in FIG. 6, and a second cleaning process P4 such as a dry clean process is performed then, as shown in FIG. 7. For example, the SPM cleaning process is performed at a temperature between 90° C. to 130° C. for a duration of 4-5 minutes. The sulfuric acid ($H_2SO_4$) and hydrogen peroxide ($H_2O_2$) used in the SPM cleaning processes may strongly oxidizes the residue, such as $(NH_4)_2SiF_6$, synthesized in the SiCoNi process without further reacting with the silicon oxide of the recessed insulating layer 330. Following these, the oxidized residue will be removed in the second cleaning process P4. For example, a standard cleaning (SC1) process is performed at a temperature between 50° C. to 75° C., for directly removing the oxidized residue with ammonium hydroxide ($NH_4OH$) and $H_2O_2$ of the SC1 process. It is noteworthy that since the above-mentioned first cleaning process P3 such as the SPM cleaning process has strongly oxidized the residue of $(NH_4)_2SiF_6$ synthesized in the SiCoNi process to form hydrosoluble polymers, such hydrosoluble polymers can easily be removed in the second cleaning process P4 through the SC1 process.

On the other hand, a curve surface 370a is also formed on the recessed insulating layer 370 in the etching back process P1 due to the different etching rates on the three insulating layers 311, 313, 315. Also, a wicking structure 340 with a height h can still be defined between a peak and a bottom of the curve surface 370a, especially between the fin shaped structures 300 in the dense region 101. The wicking structure 340 is formed between the fins and partially covers sidewalls of the fin shaped structure 300 as shown in FIG. 5. It is worth noting that, since the subsequent first and second cleaning process P3, P4 will not further react with the recessed insulating layer 370, the wicking structure 340 remain in the height h as shown in FIG. 7 instead of getting worse. For example, the height h of the wicking structure 340 is about 30 angstroms to 50 angstroms while the fins are spaced from each other in the width W of about 25 nm to 35 nm. It is noted that the term "curved surface" refers to the surface having at least one portion being curved. For example, the curved surface 370a may include two curved portions and one horizontal portion located therebetween.

As shown in FIG. 7, the wicking structure 340 includes a multilayer structure, for example including a first layer 341 being formed from the first insulating layer 311 shown in FIG. 2, and/or a second layer 343 being formed from the second insulating layer 313 shown in FIG. 2 and/or a third layer 345 being formed from the third insulating layer 315 shown in FIG. 2, in which the first layer 341, the second layer 343 and the third layer 345 preferably include silicon oxide with different densities, but is not limited thereto. In another embodiment, the first layer 321, the second layer 323 and the third layer 325 may also include different dielectric materials. The wicking structure 340 also includes a curve surface 340a as being defined by the curve surface 370a of the recessed insulating layer 370, and the curve surface 340a has an acute angle θ of about 5 degrees to 15 degrees to a horizontal surface of the bottom of the curve surface 370a as shown in FIG. 7.

Through the above mentioned steps, the semiconductor device according to the second preferred embodiment of the present invention is obtained. In the subsequent process of the present invention, a gate structure (not shown in the drawings) forming process, a SMT process and a source/drain forming process may be performed then, for forming a finFET structure (not shown in the drawings). The semiconductor device of the present embodiment includes the fin shaped structures 300 both within the dense region 101 and the isolated region 102 and the recessed insulating layer 370 covered a bottom portion 304 of each of the fin shaped structures 300 to function like a shallow trench isolation (STI). That is, a top portion 303 of each of the fin shaped structures 300 exposed from the insulating layer 370 may function like the fins as shown in FIG. 7, and the height H of the fins is substantially between 360 nm to 450 nm. The semiconductor device further includes the wicking structure 340 between fins in the dense region 101 but not in the isolated region 102, and the height h of the wicking structure 340 is about 30 to 50 angstroms while each fin are spaced from each other by a width W of about 25 nm to 35 nm.

Thus, although the wicking structure 340 still covers the sidewalls of the fin shaped structure 300, the height h thereof has been sufficiently minimized in the present embodiment. For example, the height h of the wicking structure 340 is minimized to about $1/12$ to $1/10$ of the fin height, such as about 30 angstroms to 50 angstroms. That is, the coverage of the wicking structure 340 is minimized thereby. Moreover, the first cleaning process P3 and the second cleaning process P4 may only react with the residue synthesized in the SiCoNi process instead of further reacting with the oxide of the recessed insulating layer 370, such that, the variation of the fin height after the subsequent cleaning processes will be less than 5%.

In summary, through the present invention, a two-stepped cleaning process is performed after recessing the insulating layer between the fin shaped structures to remove the synthesized residue in the recessing process without reacting with the oxide of the insulating layer. In this way, the wicking structure formed at the sidewalls of fin shaped structures in the recessing process may be sufficiently minimized especially in the dense region of the substrate, such that, the coverage of the sidewalls by the wicking structure may be also minimized thereby. Thus, the current density of the entire semiconductor device may enable to be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
    forming two fin shaped structures in a substrate;
    forming an insulating layer on the substrate to cover the fin shaped structures;
    removing a portion of the insulating layer to expose a top portion of each of the fin shaped structures and the top portion of each of the fin shaped structures having a height, wherein a recessed insulating layer having a curve surface is formed after the removing process, a wicking structure is defined between a peak and a bottom of the curve surface, and the wicking structure has a height being $1/12$ to $1/10$ of the height of the top portion of the fin shaped structures; and
    performing a first cleaning process, and the height of the top portion of each of the fin shaped structures being maintained.

2. The method of forming a semiconductor device according to claim 1, wherein the height of the wicking structure is 30 angstroms to 50 angstroms.

3. The method of forming a semiconductor device according to claim 1, wherein the wicking structure comprises a multilayer structure.

4. The method of forming a semiconductor device according to claim 1, wherein the wicking structure comprises different dielectric materials.

5. The method of forming a semiconductor device according to claim 1, wherein the first cleaning process is performed with $H_2SO_4$ and $H_2O_2$.

6. The method of forming a semiconductor device according to claim 1, further comprising:
    performing a second cleaning process after the first cleaning process.

7. The method of forming a semiconductor device according to claim 6, wherein the second cleaning process is performed with $NH_4OH$ and $H_2O_2$.

8. The method of forming a semiconductor device according to claim 1, wherein the insulating layer is removed by using a SiCoNi dry etching process.

9. The method of forming a semiconductor device according to claim 1, wherein the fin shaped structures are formed in a dense region of the substrate.

10. The method of forming a semiconductor device according to claim 1, wherein a space between the top portions of the fin shaped structures is 25 nm to 35 nm.

* * * * *